United States Patent [19]

Maddaloni

[11] 4,137,502

[45] Jan. 30, 1979

[54] RADIO-RECEIVER OR TUNER PROVIDED WITH SOLID STATE MEMORIZING MEANS FOR A MULTIPLICITY OF RECEPTION FREQUENCIES

[75] Inventor: Ciro Maddaloni, Rome, Italy

[73] Assignee: Voxson S.p.A., Italy

[21] Appl. No.: 791,251

[22] Filed: Apr. 27, 1977

[30] Foreign Application Priority Data

May 3, 1976 [IT] Italy .................................. 49305 A/76

[51] Int. Cl.² ............................................. H04B 1/26
[52] U.S. Cl. .................................... 325/455; 325/459; 325/464; 325/468
[58] Field of Search ............... 325/335, 453, 455, 459, 325/464, 465, 468, 470; 358/191, 192; 334/15

[56] References Cited

U.S. PATENT DOCUMENTS

| | | | |
|---|---|---|---|
| 3,940,702 | 2/1976 | Yoshimura et al. ................. | 325/470 |
| 3,979,680 | 9/1976 | Sakamoto ............................ | 325/468 |
| 3,990,027 | 11/1976 | Kawashima .......................... | 325/464 |
| 4,061,982 | 12/1977 | Kawashima .......................... | 325/468 |

*Primary Examiner*—Robert L. Griffin
*Assistant Examiner*—Marc E. Bookbinder
*Attorney, Agent, or Firm*—Beveridge, De Grandi, Kline & Lunsford

[57] ABSTRACT

A radio-receiver or tuner provided with a solid state memory for a multiplicity of reception frequencies, comprising: a manual member for controlling a tuner having two different positions, namely manual and memory. The manual member in its "manual" condition is arranged for controlling a variable voltage generator arranged to supply a control voltage to tune variable reactances. A digital memory is provided for memorizing a plurality of signals corresponding to a plurality of reception frequencies and reception bands. The manual control member is arranged to cause the operation of a clock generator associated with a binary counter, the outputs of the counter being arranged to drive in a known way a digital-to-analog resistance network. A voltage comparator is arranged to signal the equality between the manually adjusted tuning control voltage and the voltage at the output from the resistance network. The system further includes means for controlling the writing in the memory of the count reached by the binary counter within the digital memory in correspondence with an address preselected through a multiplicity of keys controlling the digital memory. In its second position the manual member controls the memory so that the binary word from the memory will control the resistance network in order to "re-build" the control voltage of the tuning variable reactances.

13 Claims, 9 Drawing Figures

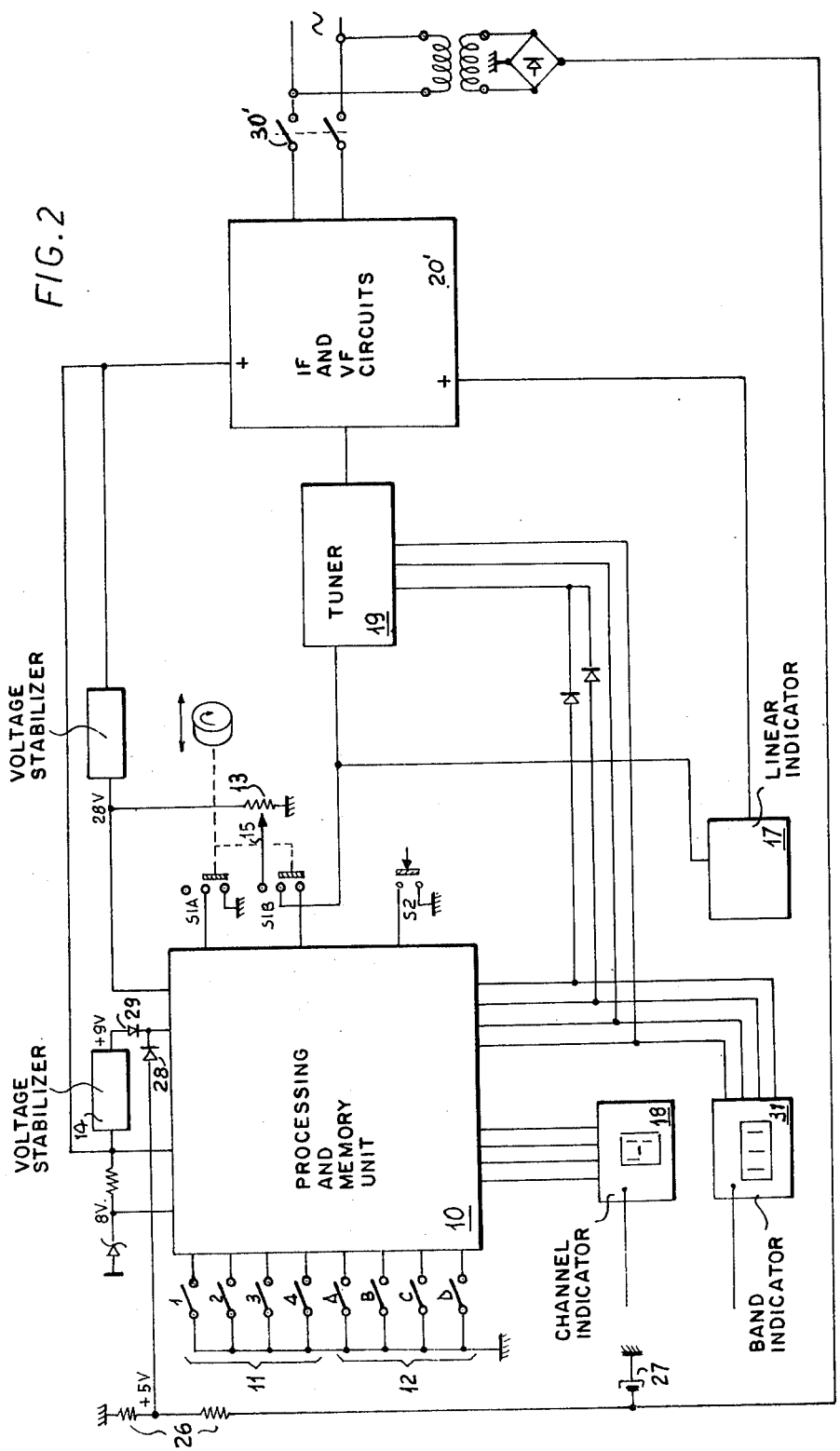

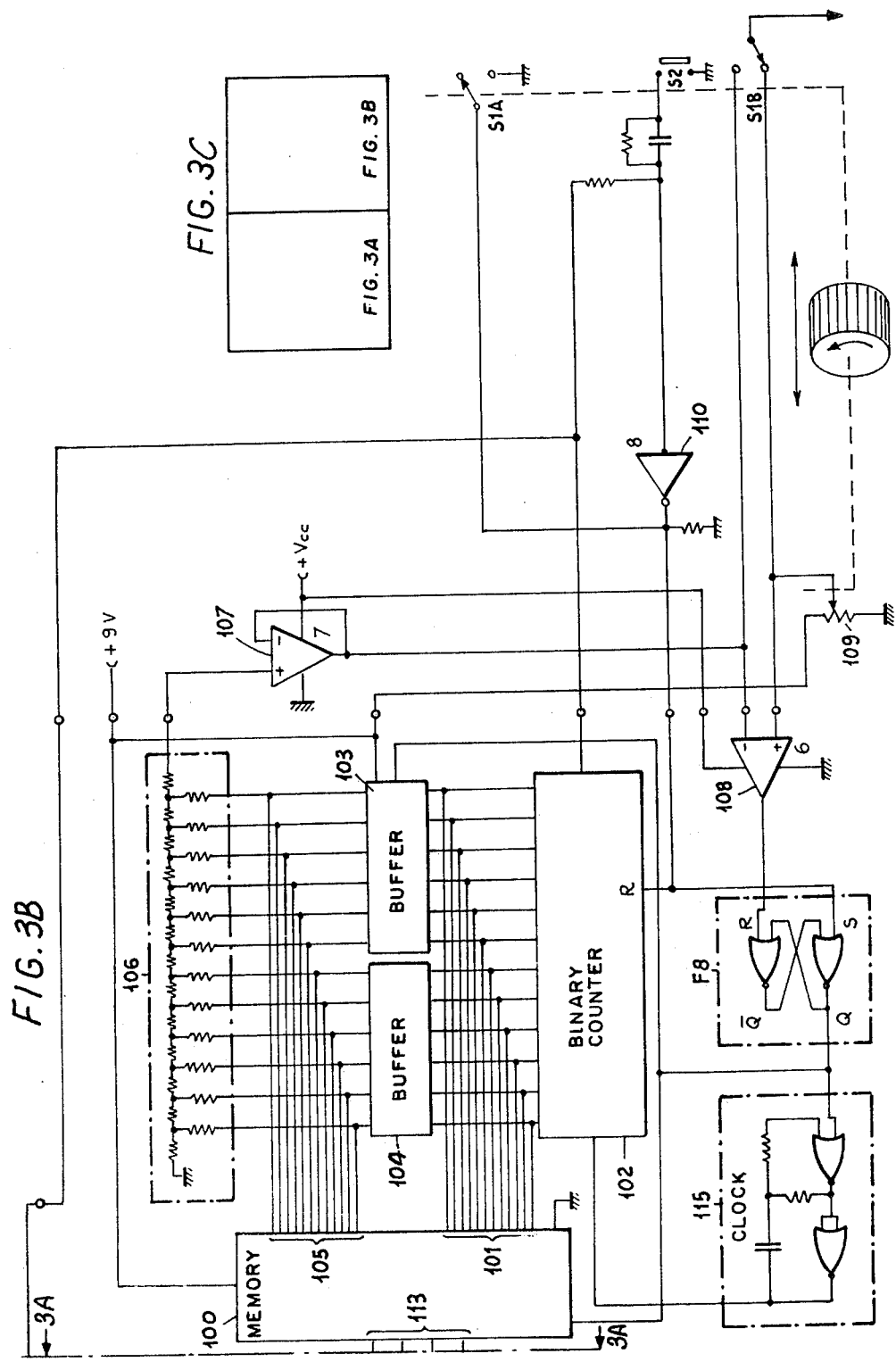

RADIO-RECEIVER OR TUNER PROVIDED WITH SOLID STATE MEMORIZING MEANS FOR A MULTIPLICITY OF RECEPTION FREQUENCIES

The present invention relates to a radio receiver or tuner provided with solid state memorizing means for a multiplicity of reception frequencies.

Tuning systems are known for radio-receivers (this term being intended in its broad meaning to include tuning units for television sets) which use solid state digital memories for storing information suitable to tune the receiver to one or more transmitting stations.

The purpose of the present invention is that of providing an arrangement for the digital memory tuning for radio receiving sets or tuners, having such a structure as to lend itself suitably to uses apparently remote from one another, such as for instance a car radio set and a tuning for a television set.

BRIEF DESCRIPTION OF DRAWING

The present invention will be now described with reference to certain embodiments at present preferred, disclosed by way of non limitative example, and with reference to the attached drawings wherein:

FIG. 2 shows a general arrangement according to this invention, applied to a television set;

FIGS. 3A and 3B, when joined as shown in FIG. 3C, show a first embodiment of the processing and memory unit of FIG. 1;

With reference to FIG. 1, a radio receiver comprising the tuning unit according to this invention includes a processing and memory unit, generally denoted by 10.

Figure 1:
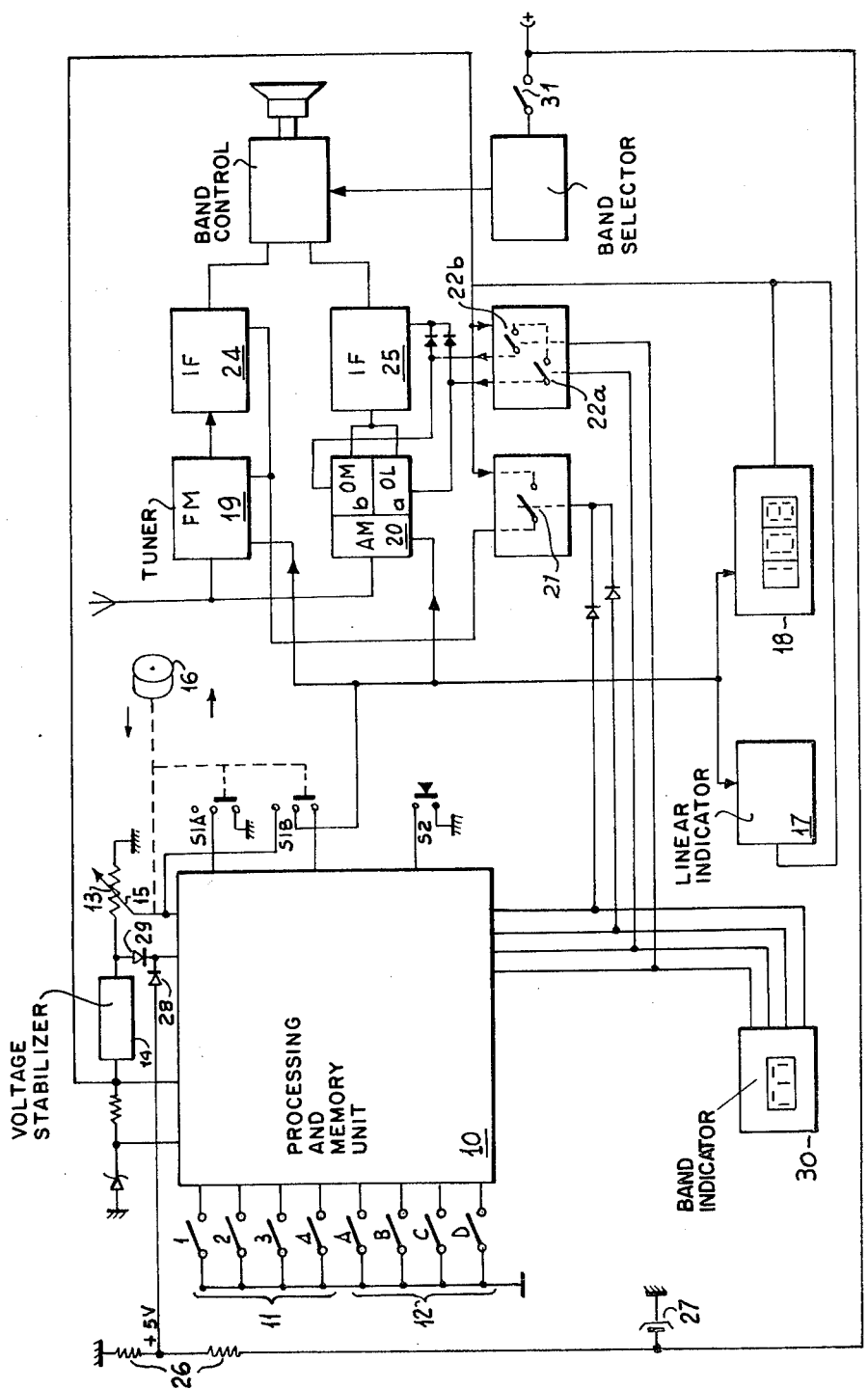
FIG. 1 shows a general arrangement according to this invention, applied to a radio receiver (car radio set)

This unit 10 includes a keyboard with keys subdivided in two groups 11 and 12. A potentiometer 13 is connected between the ground and a source 14 of stabilized voltage. The voltage on the slider 15 of the potentiometer 13 which is variable as a function of the manual tuning operation, is applied to a terminal of the processing and memory unit 10.

The tuning operation is performed by rotating a knob 16 that is mechanically associated with the potentiometer 13. Knob 16 preferably has two possible axial positions, namely depressed and withdrawn, and movement of knob 16 between these two positions controls a switch S1 having two sets of contacts, S1A, and S1B. Hereinafter, the withdrawn position of knob 16 and switch S1 will be called MANUAL, and the depressed position will be called MEMORY.

The electric control tuning elements such as varactors, of the FM tuner 19 and of the AM tuner 20 receive voltage through contacts S1B of switch S1, either directly from the slider 15 of potentiometer 13 or from the processing and memory unit 10, according to whether switch S1 is in its MANUAL position or in its MEMORY position respectively.

When the tuning knob 16 is withdrawn, the tuning of the various transmitting stations is controlled by turning this knob, in one of the reception frequency bands, which can be selected by pressing one of the keys 12.

In the described embodiment at present preferred, concerning a radio-receiver, the keys C, D of the keyboard group 12 are associated with the FM band, while the keys A, B of said group 12 are associated with the medium wave band and long wave band, respectively.

The temporary closure of one of the keys 12 applies a voltage (8.2 V) to the associated one of the switches 21, 22a and 22b feeding one of the tuners 19, 20a, 20b and an associated intermediate frequency channels 24 and 25.

When the tuning knob is depressed, the electric control tuning elements receive the voltage from the processing and memory unit 10, namely a voltage defined by the position of the slider 15 of the potentiometer 13 and previously memorized in response to actuation of the keys of group 11 together with keys of the group 12.

In the arrangement as described it is possible to memorize a maximum of 16 stations:
  4 in band A (MW)
  4 in band B (LW)
  4 in band C (FM)
  4 in band D (FM).

The selection of the various receiving stations is achieved by operating one of the band keys 12 and then one of the station keys 11.

Still with reference to FIG. 1, the display 18 provides an indication of the selected station, supplying either the frequency value of the carrier, or a number between 0 and 100 where 0 and 100 represent the upper and lower limits of the band, respectively.

Figure 5:
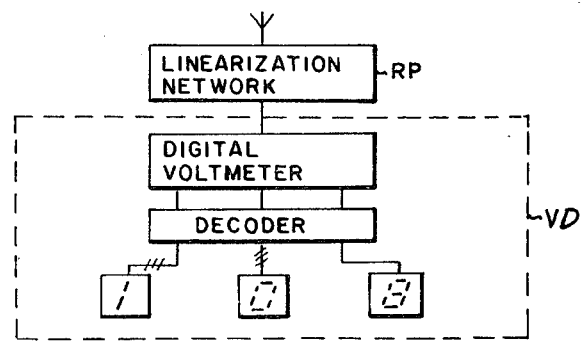
FIG. 5 shows a station selector indicator suitable for incorporation in the present invention.

The unit 18 can have the structure shown by way of example in FIG. 5. With reference to this figure, the control voltage for the varactor is applied as an input to a digital voltmeter VD embodied for instance by an integrated circuit such as the 3814 type of Fairchild, the output of which drives three "seven-segment" displays through a decoder.

As the voltage/capacity relationship, and thus voltage/frequency relationship for the varactors is not linear, it will be convenient to cause this voltage to pass through a linearization network RP before applying the voltage to the digital voltmeter VD.

Figure 6:
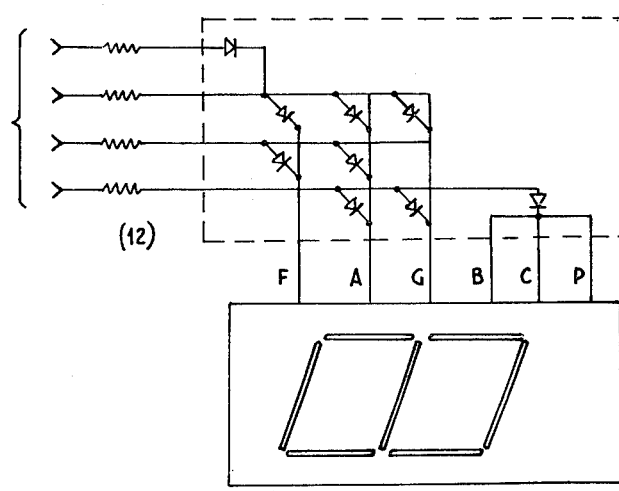
FIG. 6 shows a band selection indicator suitable for incorporation into the present invention.

The band indicator unit 30, shown in FIG. 1, can be embodied as diagrammatically shown in FIG. 6 so as to allow the band selected by the keys 12 to be visualized by a seven segment display, as shown in FIG. 6.

Figure 7:
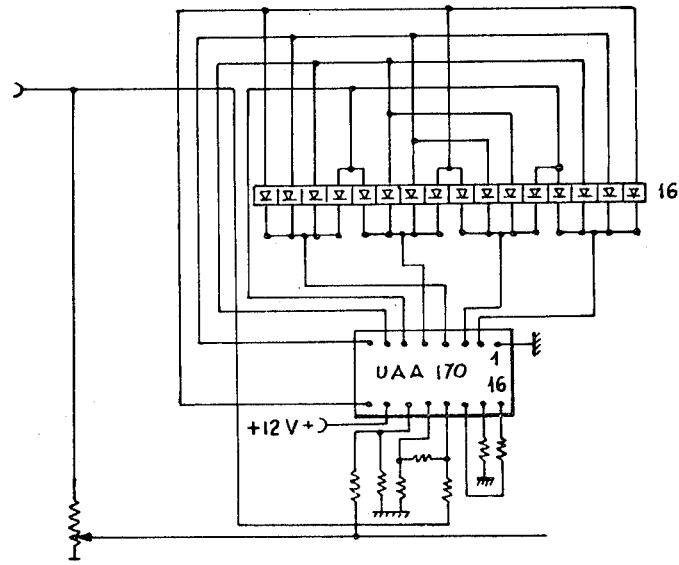
FIG. 7 shows an L.E.D. indicator suitable for incorporation into the present invention.

The FIG. 7 shows in detail a "linear" indicator denoted by 17. By said indicator the position of the station in the selected band is indicated by the lighting of one of an array of 16 LED, where the first and the last LED of the array represent respectively the beginning and the end of the band. This constitutes an optoelectronic transposition of the conventional display scale of a radio receiver.

It is deemed that the diagram of FIG. 7 requires no particular explanation, apart from the fact of indicating that an integrated circuit, provided for this use, will be used, as marketed by SIEMENS under the name UAA 170.

Reverting now to describe the unit 10, the predisposition or memorizing of a pre-selected station, can occur only by pressing the key S2 (WRITE) while knob 16 is withdrawn, since key S2 is disabled when the tuning knob 16 is depressed. This assures that the memorized information will be unadvertently cancelled.

More particularly, the memorization operation comprises the following steps:

(a) Pressing the key 12 of the selected band;
(b) searching the station to be memorized by the tuning knob 16 (knob in withdrawn position);
(c) pressing the key 11 establishing the address in which the station is wanted to be memorized;
(d) pressing the writing key (WRITE S2).

At this point by again depressing the tuning knob the transmitting station will be still tuned, but this time through the memorizing circuits 10.

In order to avoid loss of the information stored in the memory unit 10 when the power to the receiving set is cut out, the volatile memory located inside the unit 10 is connected by a diode 28 to the central point of a voltage divider 26, the high side of which is connected to the power supply battery upstream of the general switch 30.

If the apparatus is switched off at switch 30, the output from the stabilizer 14 is zero, while the anode of the diode 28 is positive so that the diode is conductive, while the diode 29 is cut off and the memory is fed by said divider 26.

If the apparatus is switched on, the output from the stabilizer 14 is + 9 Volts, while the central point of the divider 26 is at + 5 Volts.

The diode 28 is then cut off while the diode 29 is conductive and the memory is fed by the stabilizer 14.

When the apparatus is switched off, the memory needs at least 3 Volts in order to keep the data, and therefore its feeding voltage requires no stabilization. Further, since the selected memory is of the C-MOS type, its absorption is less than 1 mA, and is therefore disregardable.

The capacitor 27 serves as a buffer for some minutes if the motor car battery will have to be disconnected.

Figure 3A:
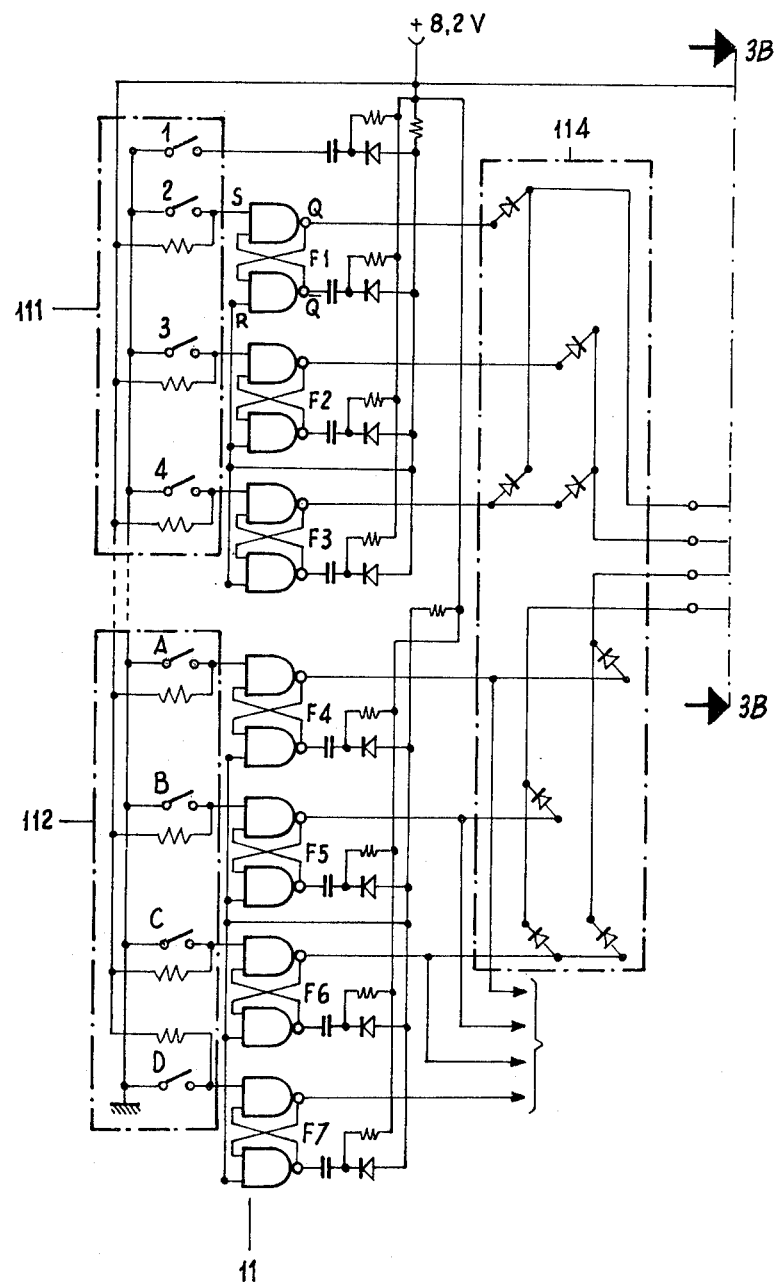

FIGS. 3A and 3B, when positioned together as depicted in FIG. 3C, form FIG. 3. With reference to FIG. 3, a first embodiment of the processing and memory unit 10, as mentioned with reference to FIG. 1, will be described.

The processing and memory unit includes a memory unit 100 formed for instance by three digital memory units of the C-MOS type, model 4725 of FAIRCHILD. The mode of associating three elementary memory units is clear to a person skilled in the art, and will not be described in detail.

The inputs 101 of the memory 100 are connected to the outputs from the 12 stage binary counter 102 for instance a 4040 FAIRCHILD counter. The outputs from the counter 102 are carried also to the inputs of the buffers 103 104 of the 40098 type. The outputs from the buffers 103, 104 are connected in parallel to the outputs 105 from the memory 100 and to the terminals of a digital-to-analog converter resistance network 106 respectively.

The output from the resistance network 106 is connected to the "voltage follower" 107 the output from which is connected to one of the inputs of the comparator 108. The output from the network 106 is also connected through voltage follower 107 to a stationary contact of the switch S1B; the other stationary contact of the switch S1B is connected to the slider of the tuning potentiometer 109. The movable contact of the switch S1B supplies, therefore the control voltage of the varactor from the voltage follower 107 when it is in memory position, and from the slider of the potentiometer 109 when it is in manual position. The switch S1B is mechanically coupled to the switch S1A which connects to ground the output from the inverter 110 for the reasons which will be set out hereinafter.

The inputs 113 for the address control of the digital memory 100 are driven through the matrix 114 by the groups of switches 111 and 112. The switches 111 and 112 are associated with flip-flops F1, F2, F3 and F4, F5, F6, F7, respectively. Also, a control flip flop F8 and a clock oscillator 115 are present.

The operation of the circuit shown in FIG. 3 is as follows:

In "manual" position, namely with the knob 16 withdrawn, the varactors receive the voltage from the slider of the potentiometer 109 mechanically associated with the tuning knob. By turning said knob the various stations will be tuned in a band predisposed by operating one of the switches 112, positioning correspondingly one of the flip flops F4 ... F7 to cause the resetting of that which was possibly already positioned with reference to another band.

The operation of memorization of a station occurs as follows:

By pressing two address keys (group 111 and group 112) the memory 100 will be predisposed on a certain address. The input S of the flip flop F8 is at a ZERO logic, whereby for whatever condition of the input R, the output Q is at ONE logic. Under these conditions the input R/W of the memory 100 is at ONE level (Read) and the buffers 103, 104 are disabled (the input E is at level ONE, the buffers 103, 104 are of the "tri-state" type). Further, the clock-oscillator 115 will be disabled.

Let us assume that a certain transmitting station has been turned. By pressing the key WRITE S2, a pulse will be sent to the input S of the flip flop F8 which will change its state whereby the output Q goes to ZERO logic enabling the clock oscillator 115 and the buffers 103, 104. This will bring to ZERO logic the control R/W of the memory enabling it to write.

Further the counter 102 will be reset, carrying to zero the output from the resistance network 106.

The output comparator 108 will be reset carrying to ZERO logic the input R of the flip flop F8. As now the clock generator 115 is enabled, this generator produces pulses which are counted by the counter 102; the 12 bit word at the outputs from the counter goes to the inputs 101 of the memory 100 and through the buffers 103, 104 to the network 106 producing a ramp on the output therefrom. The voltage ramp on the output from the resistance network 106 reaches, through the voltage follower 107 the input of the comparator 108.

When the voltage at the output from the voltage follower 107 coincides with the voltage present on the slider of the potentiometer 109, the output from the comparator 108 triggers the input R of the flip flop F8. Therefore, the output Q from the flip flop F8 goes to ONE, disabling the clock oscillator 115, and the buffers 103, 104 and bringing the memory 100 again to its READ position.

Let us consider now the "memory" condition. The switches S1A, S1B are in their "memory" position (with the tuning knob in depressed position).

The varactors receive the voltage from the resistance network 106 through the voltage follower 107. The resistance network 106 receives the binary data from the outputs 105 of the memory 100 corresponding to the address selected on the inputs 113 of said memory.

By pressing two keys, one of the group 111 and one of the group 112 respectively, the memory 100 will supply at its outputs 105, the data previously memorized to the network 106 so that the varicaps will receive the voltage allowing a memorized station to be tuned again.

In the arrangement described up to now, the output from the resistance network 106 can vary from about zero Volt to about the feeding voltage for the memory 100 and the buffers 103, 104.

The maximum voltage available at the outputs from said network 106 could not be sufficient in certain cases, such as for instance for controlling the varactors of a tuner for television sets. In this case it will be possible to interpose suitably buffers for high voltages between the nodes between the outputs from the buffers 103, 104 and the outputs from memory 100, and the inputs to the network 106 so as to have a greater voltage excursion. A modification of this kind can be made by a person skilled in the art and will not be disclosed in detail.

Still, in the arrangement described up to now, reference is made to a digital memory unit 100 of "non transparent" type, namely a memory wherein the inputs 101 are physically separated from the outputs 105.

Within the scope of the present invention comes also the use of a so-called "transparent" memory wherein at the output terminals are present those data which are applied to the inputs. In this case, considering the available "transparent" memories, available in the market, such as the 3538-I FAIRCHILD, it will be suitable to insert between the outputs from the memories and the inputs to the resistance network, buffers such as for instance the 4050 FAIRCHILD buffers.

Figure 4:
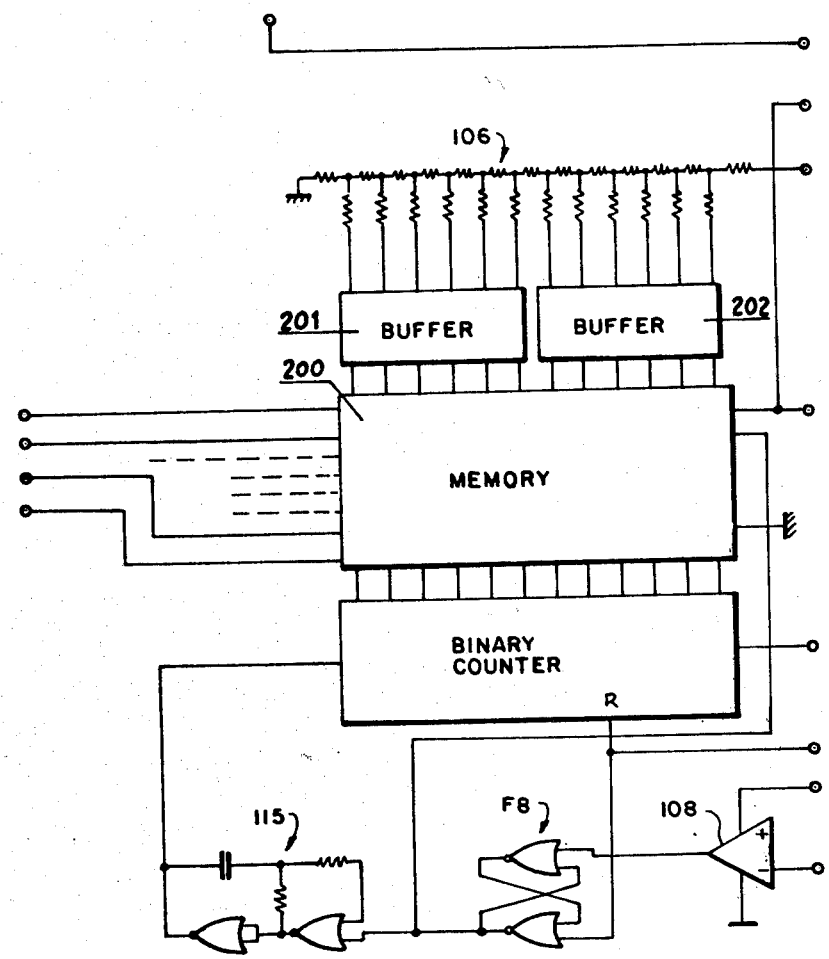
FIG. 4 shows a second embodiment of the processing and memory unit of FIG. 1.

One variant of the memory circuit is shown in FIG. 4 wherein the circuits and components of FIG. 3 which remain unchanged are denoted by the same numeral references as in FIG. 3. A transparent memory 200 is provided associated with buffers 201, 202 to drive the resistance network 106.

The FIG. 2 shows a diagram equivalent to that of FIG. 1, suitable particularly for a television set. The circuit structure is substantially identical to that described with reference to FIG. 1.

The sole changes consist in that a single tuner 19' is provided, driving the intermediate frequency and video frequency circuits 20' of the television set. Further instead of the frequency indicator 18 of FIG. 1, a digital channel indicator 18' for the received channel is provided, associated withthe keys of the group 11, and a received band indicator 30 is associated with the keys of the group 12.

Having thus described the present invention what is claimed is:

1. A receiver-tuner comprising:
first control means capable alternatively of assuming a manual condition and a memory condition;
a clock generator for generating clock pulses;
a binary counter, having a count input connected to said clock generator, a reset input, and an output, for counting the clock pulses and providing a count signal indicative thereof;
momentary contact control means normally assuming a first condition and capable of momentarily assuming a second condition and connected to said binary counter reset input to reset said binary counter upon assuming its second condition;
a digital-to-analog converter resistance network connected to said binary counter output for generating an analog count signal voltage indicative of the binary counter count signal;
a variable voltage generator for generating a control voltage and including means for selecting the level of the control voltage;
a voltage comparator having a first input connected to said variable voltage generator, for receipt of the control voltage therefrom, and having a second input connected to said resistance network, for receipt of the analog count signal voltage therefrom, for providing a first comparator output indication when the control voltage is greater than the count signal voltage and providing a second output indication when the control voltage is less than the count signal voltage;
further control means connected to said first control means, to said momentary contact control means, to said voltage comparator, and to said clock generator and responsive to said momentary contact control means assuming its second condition while said first control means is in its memory condition to activate said clock generator to start generation of clock pulses, and responsive to said voltage comparator second output indication to deactivate said clock generator to stop generation of clock pulses;
a digital memory having a plurality of storage locations, for storing signals indicative of a plurality of reception frequencies, and of a plurality of reception bands;
manual key means coupled to said digital memory for selecting one of said plurality of storage locations;
means coupling said binary counter output to said digital memory and responsive to actuation of said key means in a first meanner to select one of said plurality of storage locations and to write the count signal provided by said binary counter at the time said voltage comparator provides the second output indication into that selected one of said plurality of storage locations;
means coupling said digital memory to said resistance network and responsive to activation of said key means in a second manner to select one of said plurality of storage and locations and to apply the count signal stored in that selected one of said plurality of storage locations to said resistance network;
variable tuning reactance means; and
means responsive to said first control means being in its manual condition for applying the control voltage to said tuning reactance means and responsive to said first control means being in its memory condition for applying the analog count signal voltage to said tuning reactance means.

2. A receiver-tuner as claimed in claim 1 in which said variable tuning reactance means comprises varactors.

3. A receiver-tuner as claimed in claim 1 further comprising display means for indicating the radio reception frequency corresponding with the voltage applied to said tuning reactance means, said display means including a linearization network, for converting the voltage applied to said tuning reactance means into a digital signal, and a digital voltmeter.

4. A receiver-tuner as claimed in claim 3 further comprising further display means for indicating the radio reception band corresponding with the voltage applied to said tuning reactance means, said further display means including an optoelectronic element for producing a symbol corresponding to that band.

5. A receiver-turner as claimed in claim 1 comprising display means for indicating the radio reception band corresponding with the voltage applied to said tuning reactance means, said display means including an optoelectronic element for producing a symbol corresponding to that band.

6. A receiver-tuner as claimed in claim 1 further comprising an aligned plurality of light emitting diodes coupled to said tuning reactance means for providing a linear analog indication of the radio reception frequency.

7. A receiver-tuner as claimed in claim 1 in which the voltages applied to said variable tuning reactances during one of the reception bands corresponds to television reception frequencies, said receiver-tuner further comprising display means for indicating the reception channel and the reception band associated with the voltage applied to said variable tuning reactances.

8. A receiver-tuner as claimed in claim 1 in which said digital memory is a non-transparent memory.

9. A receiver-tuner as claimed in claim 1 in which said digital memory is a transparent memory.

10. A receiver-tuner as claimed in claim 1 further comprising a main power switch for controlling power to said receiver-tuner and by-pass power supply means for supplying power to said digital memory to hold the signals stored therein when power is cut off by said main power switch.

11. A receiver-tuner as claimed in claim 10 further comprising emergency power storage and supply means for supplying power to said digital memory to hold the signals stored therein when power is cut off by said main power switch and said by-pass power supply means is inoperative.

12. A receiver-tuner as claimed in claim 1 further comprising a main power switch for controlling power to said receiver-tuner and emergency power storage and supply means for supplying power to said digital memory to hold signals stored therein when power is cut off by said main power switch.

13. A receiver-tuner as claimed in claim 1 in which said first control means and said variable voltage generator level selecting means comprise a tuning knob capable of placement alternatively in a depressed position and in a withdrawn position, to correspond with the two conditions of said first control means, and capable of rotation to select the level of the control voltage.

* * * * *